4,034,355

Carlsen

July 5, 1977

[54] HOLOGRAPHIC DIGITAL DATA PROCESSING SYSTEM WITH SEQUENTIAL DATA STORAGE AND RETRIEVAL

[75] Inventor: W. John Carlsen, Natick, Mass.

[73] Assignee: GTE Laboratories Incorporated, Waltham, Mass.

[22] Filed: May 5, 1975

[21] Appl. No.: 574,479

Related U.S. Application Data

[63] Continuation-in-part of Ser. No. 432,912, Jan. 14, 1974, Pat. No. 3,891,976.

[52] U.S. Cl. .................. 340/173 LM; 340/173 LT; 350/3.5; 358/9 D
[51] Int. Cl.² .................. G11C 13/04; G02B 27/38
[58] Field of Search ............... 340/173 LM, 173 LT; 350/3.5; 178/6.7 R, 6.7 A; 179/100.3 G; 346/76 L

[56] References Cited

UNITED STATES PATENTS

| | | | |
|---|---|---|---|
| 3,407,405 | 10/1968 | Hoadley | 340/173 LM |
| 3,408,656 | 10/1968 | Lamberts | 340/173 LM |
| 3,657,473 | 4/1972 | Corcoran | 350/3.5 |
| 3,720,921 | 3/1973 | Schools et al. | 340/173 LM |
| 3,774,986 | 11/1973 | Bourgoin et al. | 350/3.5 |
| 3,812,496 | 5/1974 | Brooks | 340/173 LM |

OTHER PUBLICATIONS

Roberts et al., High Speed Holographic Digital Recorder, Digest of Technical Papers of Topical Meeting on Optical Storage of Digital Data, Aspen, Colo. (19–21, Mar. 1973), pp. WA3–1 to 3–5.
Bardos, Wideband Holographic Recorder, Digest of Technical Papers of Topical Meeting on Optical Storage of Digital Data, Aspen, Colo. (19–21, Mar. 1973), pp. WA2–1 to 2–4.

Primary Examiner—Stuart N. Hecker
Attorney, Agent, or Firm—Irving M. Kriegsman; Bernard L. Sweeney; Robert A. Seldon

[57] ABSTRACT

A holographic digital data processing system is described in which the data is stored holographically in a recording medium with the data insertable and retrievable in a sequential manner. A modulated data beam and a similarly modulated reference beam are passed through various deflectors to intersect at the recording medium to form the local holographic pattern. The location in the recording of the intersection is controlled by a page deflector which deflects both beams through the same angle and the angle of intersection is controlled by a data deflector which deflects only the data beam. Therefore, each data bit is recorded with a distinct angular relationship between the interfering data and reference beams. During reconstruction, the reference beam is occluded and the data beam is passed through both the data deflector and the page deflector to intersect the recording medium at the unique address of a single bit of digital data which is desired to be read out. The image of that bit is formed in an image plane at a fixed location for all bits. A single photodetector is positioned at that location and serves to read-out the data stored in the holographic memory. In this manner, sequential digital data storage and retrieval is accomplished with a holographic storage medium.

15 Claims, 4 Drawing Figures

HOLOGRAPHIC DIGITAL DATA PROCESSING SYSTEM WITH SEQUENTIAL DATA STORAGE AND RETRIEVAL

CROSS-REFERENCE TO A RELATED APPLICATION

This application is a continuation-in-part of my earlier filed application, Ser. No. 432,912, filed Jan. 14, 1974, and now issued as U.S. Pat. No. 3,891,976.

BACKGROUND OF THE INVENTION

This invention is related generally to an improved method and apparatus for storing and retrieving digital data utilizing holograms and more specifically, to a novel and improved method and apparatus for sequentially recording and retrieving individual bits of digital data in and from such holographic memories.

The use of holograms as a medium for storing digital data is well known in the art. A conventional holographic data memory is formed by initially arranging the data to be stored in a planar array. This array is composed initially as a "page" of data and is placed in an intermediate temporary storage device commonly referred to as a "page composer". The page composer is usually an array of cells, each of which may be made either opaque or transparent according to whether a binary 0 or 1 is to be stored at that particular cell address. After the entire page of data has been formed, it is illuminated with laser light and holographically recorded on a holographic storage medium.

Several formats for recording a large number of such pages in a single hologram memory have been reported. In one such form, a page array of small normally transparent cells is composed. This page is then recorded holographically on a photographic medium as a single hologram by illuminating the transparent page composer with laser light and focussing the transmitted laser light onto a small area of the recording medium where it is caused to interfere with a reference beam. Following the recording of the first page, another page of digital data is composed in the page composer, and likewise recorded by interfering with the reference beam but in another area of the recording medium. This process is continued until either all of the data is recorded or space in the recording medium is exhausted.

Another format, which is less commonly employed, involves the use of the angular selectivity inherent in the recording of so-called Lippmann-Bragg volume holograms. Such holograms are formed throughout the volume of a thick recording medium instead of on the surface of a thin planar recording mdium. In a volume holographic recording, each page of data is superimposed upon a number of others in the same volume of the recording medium; however, with each exposure, the reference beam is incident on the medium from a different recording angle.

During the playback or read-out of data from holograms formed according to the former methods, a reference laser beam is employed. In the previously described first format, the reference beam is directed onto a selected small area including the desired hologram with its page array of data. An image of the original page composer with its array of digital data in the form of light and dark spots for that page is reconstructed. The reconstructed page image is formed in a detection plane where an array of photodetectors is placed to interrogate each individual data bit.

The projected data array is read-out electronically with the photodetectors which sense the presence or absence of light at each bit position in the image array. The read-out of a page from a Lippmann-Bragg volume holographic memory is performed in a similar manner. A reference beam is directed into the volume hologram from the specific angle used to record that particular page and the resulting data array is imaged and reconstructed for electronic detection. Other pages in the volume hologram memory are accessed by orienting the reference beam at different angles associated with those pages during recording.

These prior art methods for storing and retrieving data present certain disadvantages. For example, to be practical, a page of data must include a large number of individual bits of digital data. The parallel recording of an entire such page of digital data involves the simultaneous illumination of all of the data bits in the page composer with a common data beam. Such simultaneous illumination creates intermodulation noise which is caused by the interference of rays from individual data bits at the recording medium. During read-out, such noise results in a flare of diffracted light for which special care must be taken to keep the flare from creating detection interference on the detector plane. Failure to take such precautions causes serious signal-to-noise problems. In order to avoid flare problems, the readout involves using reference beams at relatively large angles from the data beams to prevent the flare from falling directly or being scattered onto the detector plane. Since no data bits can be recorded within a minimum solid angle around the reference beam where the flare is located, that minimum part of the storage capacity of the holographic recording medium around the reference beam is essentially wasted.

Another disadvantage of the prior art systems involves the requirement that a full page of data must be temporarily stored to enable an optical version to be composed followed by subsequent storage on the holographic recording medium.

Another disadvantage arises because a substantial amount of laser beam power is wasted through losses encountered with the page composer which is opaque in many places such as the areas where zeroes are stored, the areas between the data, unused addresses and border areas. Consequently, much of the laser light used to illuminate the page composer is not transmitted and recorded, but is wasted by absorption. Hence, for any given laser beam power that may be available, the time to store data will be significantly longer than in comparison with a storage method with which all of the laser power could be used to record the data. The only manner in which storage time can be reduced is to increase the laser illumination power. However, given the present state of the art in lasers, such an increase can only be accomplished at significant increases in cost, both for operation and equipment.

The page composer required in prior art holographic data memory devices involves a complex structure utilizing many individually addressable electro-optic light valve cells, commonly of the order of 10,000 or more, to achieve practical densities in the storage medium. Such a page composer is extremely complex to design and to produce; it thus represents a generally undesirable component in a hologram memory storage system.

A further disadvantage occurs during read-out and has two aspects. This disadvantage is that the entire page of digital data is presented simultaneously to the read-out. If, for example, a page of data is a matrix of 10,000 bits, a like number of photodetectors and their associated circuitry are required. Obviously, such a device is complex and costly in design and construction and low in reliability. Furthermore, unless the read-out is directly integrated into a computer main frame, the data cannot be utilized at a speed even close to that at which it is available. Normally, the data is utilized in a sequential manner. Also, in many instances, only one or a few bits of data from a page are actually required at a specific time. At such times, generation of all data stored in that page creates much waste.

SUMMARY OF THE INVENTION

It is, therefore, an object of the present invention to provide a novel method and apparatus for storing and retrieving digital data in a holographic digital data processing system.

It is a second object of the invention to provide such a novel method and apparatus which do not require composition of pages of digital data or read-out from an array of images constituting a page of digital data.

It is another object of the present invention to provide such an apparatus which is a significant reduction in complexity from prior art systems.

Briefly, the invention in its broadest aspect is a holographic digital data processing system in which data may be stored and retrieved in a sequential manner. The system includes a source of a beam of coherent energy. A beam divider splits the beam of coherent energy into a reference beam and a data beam. A modulator then impresses a bit of digital data on at least one of the beams of coherent energy. A first beam deflector deflects the data beam by a first preselected angle selected from a first matrix array of angles. Means are provided for by-passing the first beam deflector with the reference beam to establish a unique spatial relationship between the data beam and the reference beam. A second beam deflector deflects both the data beam and the reference beam by a second preselected angle selected from a second matrix array of angles. A recording medium is included in which a hologram may be formed. A means focusses the data beam and the reference beam into the recording medium so that the data beam and the reference beam interfere and form a hologram of the bit of digital data in the recording medium. The second preselected angle determines the position of the hologram in the recording medium and the first preselected angle determines the angle of intersection of the data beam and the reference beam at the recording medium whereby the hologram of the bit of digital data has a unique address within the recording medium and may be stored in the recording medium in a sequential manner. A means selectively occludes the reference beam before reaching the recording medium so that the data beam is directed onto the recording medium at the hologram of a stored bit of digital data thereby forming the image of the single bit of digital data beyond the recording medium at a fixed location which is defined by the reference beam when the hologram is recorded. Finally, a photodetector is located at the image of the bit of digital data so that the image of the bit of digital data stored at a particular address in the recording medium may be retrieved individually in a sequential manner.

In a holographic memory apparatus in accordance with the invention, a sequential storage technique is used to directly input one data bit at a time into the hologram memory at an appropriate address in the recording medium as the bit arrives at an input to the system. In this manner, a page composer is eliminated and the full laser beam power is available to record the data. A holographic memory system in accordance with the invention provides high speed recording with practically high data storage densities for an efficient operation.

Each individual data bit in a page is recorded holographically with a preselected recording angle between the data and reference beams. Hence, since the reference beam orientation is constant for a page, there exists for each data bit in a page a particular intersection angle of the data beam at the recording medium. This intersection angle serves as the address information for the bits in a page. The plurality of data bits within a page are recorded on the medium by superimposing the bits upon each other to form a localized multiple exposure synthetic page hologram. An entire array of such pages of holograms may thus be conveniently recorded on the medium at respectively different locations.

To retrieve any selected bit of digital data from the holographic memory, the reference beam is first occluded. The data beam is then directed by the two beam deflectors to the address of the bit in the memory. An image of the bit is thereby reconstructed at the normal intersection of the reference beam and an image plane. A photodetector located at that intersection senses the bit of digital data.

These and other objects, advantages and features of the invention will be apparent from the following detailed description of the preferred embodiments taken together with the accompanying drawing.

BRIEF DESCRIPTION OF THE DRAWING

In the Drawing:

FIG. 4 is a schematic view of an alternative form for the beam deflection portion of the holographic memory shown in FIGS. 1 through 3.

DETAILED DESCRIPTION OF THE PREFERRED EMBODIMENTS

Figure 1:
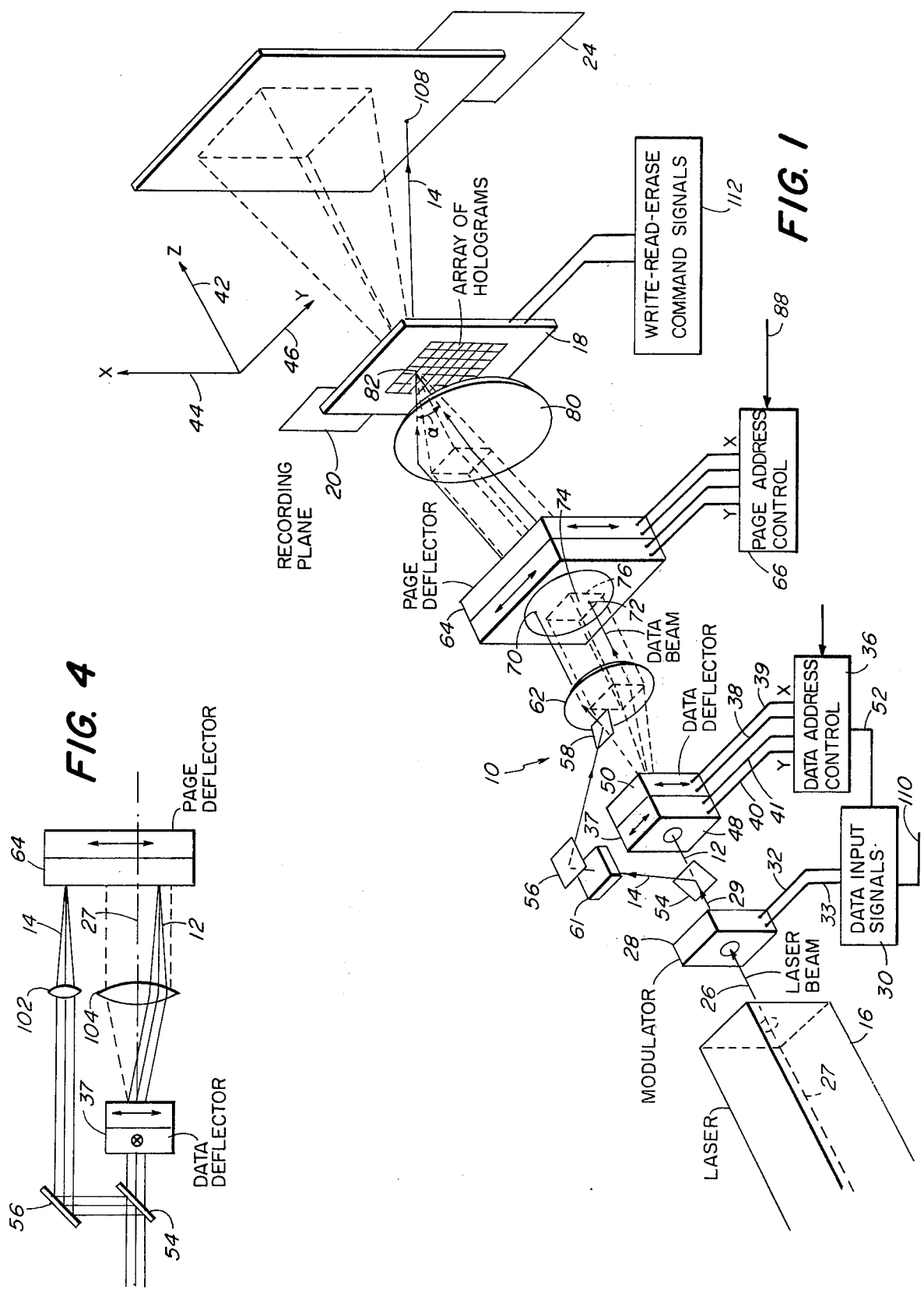
FIG. 1 is a perspective, partially schematic illustration of a holographic digital data processing system according to the present invention having sequential data storage and retrieval.

In referring to the various figures of the drawing hereinbelow, like reference numerals will be used to refer to identical parts of the apparatus.

Figure 2:
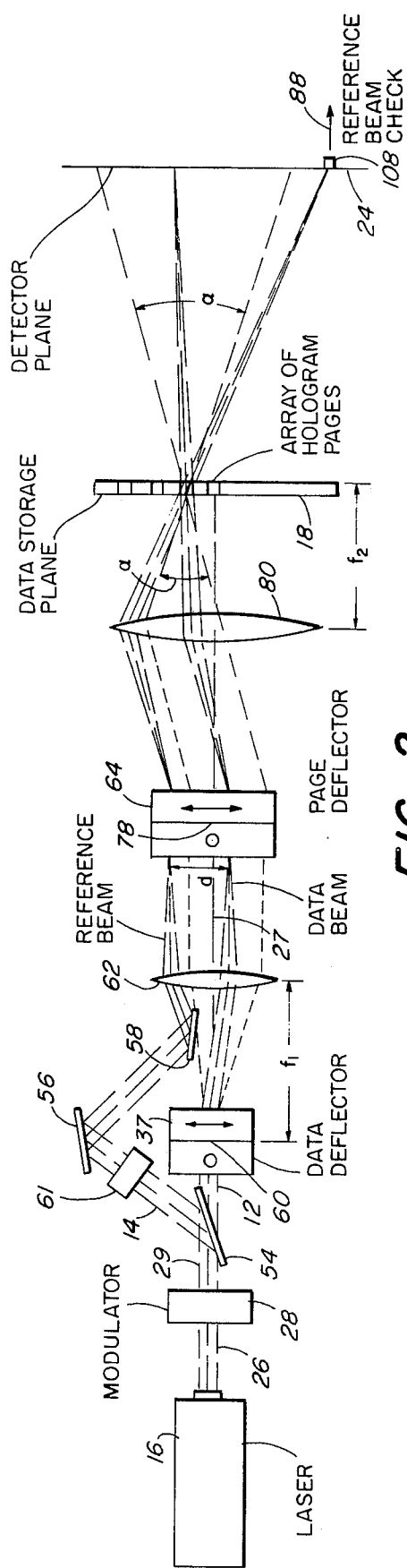
FIG. 2 is a side schematic illustration of the holographic memory shown in FIG. 1; the system being shown in the WRITE mode of operation.
Figure 3:
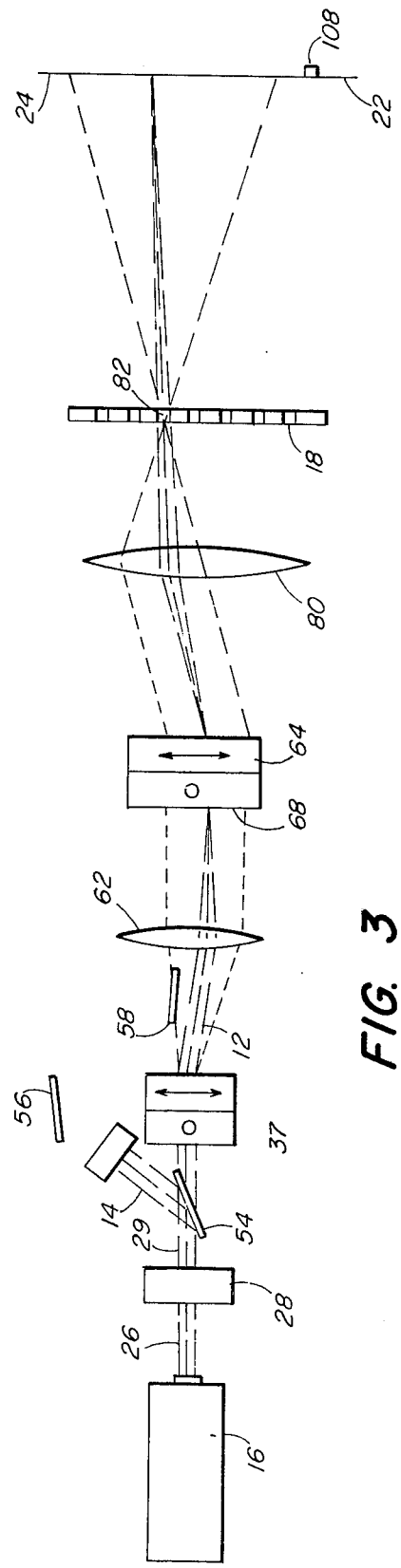
FIG. 3 is a similar schematic illustration of the holographic memory as shown in FIGS. 1 and 2, but being shown in the READ mode of operation.

Referring initially to the embodiment shown schematically in FIGS. 1 through 3, a holographic digital data processing system in accordance with the invention is indicated generally by the reference numeral 10. The holographic digital data processing system 10 includes a laser 16 or other source of coherent light. The laser source 16 may operate in the visible, infrared or ultraviolet portions of the electromagnetic spectrum, depending upon the spectral sensitivities of a storage medium 18 located in a recording plane 20 and of a photodetector 108 disposed in a detection plane 24.

The output of the laser 16 is a laser beam 26 which is aligned along an optical axis 27. The laser beam 26 encounters an electro-optic data modulator 28 which intensity modulates the beam 26 in accordance with a bit of digital data to be stored in the storage medium 18. A data input signal source 30 provides modulation signals to the modulator 28 on lines 32 and 33 to intensity modulate the laser beam 26. The modulation signals from data input signal source 30 result in the formation of zeroes and ones by, for example, respectively inhibiting and allowing the passage of the laser beam 26 through the modulator 28.

A modulated laser beam 29 from the modulator 28 is incident on a beam splitter 54 where it is divided into a reference beam 14 and a data beam 12 with both beams being modulated with the bit of digital data. The data beam 12 is applied to a data beam deflector 37 which deflects the data beam 12 according to (x) deflection signals on lines 38 and 39 and (y) deflection signals on lines 40 and 41 which are generated by a data address control source 36. It should be noted here that the optical axis 27 of the system 10 is aligned nominally parallel with the (z) axis 42 of an orthogonal coordinate system as shown in FIG. 1. The recording plane 20 and the detection plane 24 are each normal to the optical axis 27 and parallel to the (x) and (y) axes 44 and 46.

The first or data beam deflector 37 is capable of deflecting the data beam 12 through a multitude of discrete angles selected from a matrix array of angles. The matrix array of angles is defined by a pair of orthogonally imposed beam deflection signals, these signals being applied in the (x) and (y) directions. Each of the respective deflection signals can be applied in a plurality of discrete levels, each level corresponding to a discrete angle of data beam deflection in a direction parallel to the (x) and (y) axes. Two stages of beam deflectors 48 and 50 are combined in data beam deflector 37 to deflect the data beam 12 in the (y) and (x) directions respectively. Therefore, by combining the effects of the beam deflector stages 48 and 50, data beam deflection to a discrete angular position within a defined solid angle is achieved.

Preferably, the data beam deflector 37 is an electro-optic device; however, other means by which the deflection may be accomplished including tilting mirrors are intended to be included within the purview of the invention. The discrete angular deflection of the data beam 12 is selected to establish a unique spatial relationship between the data beam and the reference beam which corresponds with a desired angular relationship between the reference beam 14 and the data beam 12 during their intersection in the recording plane 20. The data deflection control signals on lines 38, 39, 40 and 41 are synchronized to the modulation of the laser beam 26, as suggested by a sync line 52, so that each bit is stored with a distinct angular relationship between the data and reference beams 12 and 14.

The angular deflection of the data beam 12 may be controlled, for example, to any of 500 discrete angular positions in each of the (x) and (y) directions. Thus, a total angular array of 250,000 possible bit positions can be achieved for each recorded page of digital data. The specific deflector employed is not critical so long as each discrete deflection angle is the same for all of the rays within the data beam 12. The angle of intersection $\alpha$, between the data and reference beams 12 and 14 is thus an angle whose magnitude and rotational orientation are dependent upon the relative magnitudes of the (x) and (y) deflections of the data beam 12 imposed by the data beam deflector 37.

The reference beam 14, in this embodiment, is directed by the beam splitter 54 and a pair of reflectors 56 and 58 past the data deflector 37 such that after the last reflection, the reference beam 14 appears to emerge or travel away from the intersection 60 of the optical axis 27 with the center of the scan of the data beam deflector 37. In this manner, both the reference and data beams 12 and 14 appear to diverge from a common fixed origin 60 (see FIG. 2) located within the data beam deflector 37 and on the optical axis 27. Although reflectors 56 and 58 are used in the preferred embodiment, any other means for by-passing the first beam deflector 37 with the reference beam 14 is also included in the purview of the invention.

In addition, the reference beam 14 passes through a reference beam switch 61. The switch 61 is located optically in that section of the apparatus between the beam divider 54 and the intersection of the data and reference beams 12 and 14 at the recording plane 20. The function of the reference beam switch 61 will be discussed more fully hereinbelow.

The deflected data beam 12 and the reference beam 14 are directed onto a first lens 62, which is aligned on the optical axis 27. The lens 62 is so placed as to intercept these two beams at a distance of one focal length $f_1$ from the center of scan 60 of the data beam deflector 37. The lens 62 serves to collimate both of the beams 12 and 14 with their relative unique spatial relationship previously defined as the angle therebetween prior to the lens 62, and now expressed by the dimension ($d$), their relative position being determinative of the discrete recording or intersection angle $\alpha$ of the data and reference beams 12 and 14 at the recording plane 20.

The parallel data and reference beams 12 and 14 are applied to a second beam or page deflector 64. The page deflector 64, which functions in an identical manner as the data beam deflector 37, however, which may be of differing construction, such as acousto-optic devices, also provides identical two dimensional deflection of both of the beams 12 and 14 in the (x) and (y) directions to correspond with the desired location of the page of digital data in the array of holograms to be recorded in the recording plane 20. The deflection signals for the page deflector 64 are obtained from a page address control network 66 which determines, such as under control from a data processor, where the page of digital data is to be recorded in the recording medium 18. Here again, the deflection angle imposed by the page deflector 64 is selectable from a second matrix array of angles. The second matrix array of angles is defined in the same manner as the first matrix array of angles described above.

The parallel entry of the data and reference beams 12 and 14 into the page deflector 64 accommodates the requirement for some deflectors such as acousto-optic deflectors that the light beams to be deflected enter parallel to each other. For other types of deflectors, the beam position parameters may be changed over an extensive range as determined by the optical designer who may wish to optimize his design for a specific application and with particular components in mind.

The lens 62 directs the reference and data beams 12 and 14 parallel to each other and the optical axis 27 of the lens 62. The rays which constitute the individual beams 12 and 14 converge to a focussed spot at a distance of one focal length beyond the lens 62. However, since diffraction effects render the rays of a laser beam parallel at the focal point, the focal length $f_1$ for the lens 62 is made sufficiently long to provide a region of essentially parallel rays. If the particular type of deflector used as the page deflector 64 requires parallelism of the rays passing therethrough, the page deflector 64 should be located at the focal point of the lens 62. FIG. 1 illustrates the distribution or spacing of the data and reference beams 12 and 14 at the entrance plane 68 to the page deflector 64. In this entrance plane 68, which is perpendicular to the optical axis 27 and preferably located one focal length beyond the first lens 62, the reference beam 14 arrives at a fixed location, such as 70, while the position or location 72 where the focussed data beam 12 arrives is determined by the specific deflection imposed by the data beam deflector 37.

For example, with a data beam deflector 37 as described above, there is an array of 500 by 500 possible discrete data positions in the entrance plane 68 through which the data beam 12 may pass. The area 74 through which the data beam 12 may pass is outlined in the form of a square with dashed lines 76.

The array of positions enclosed by the lines 76 corresponds to the data "page" which may be stored in the holographic memory, i.e., the recording medium 18. The area 74 differs from the conventional previously described page composer in that there is no physical object necessary for temporary storage of the digital data. Rather, the complete set of possible data light beam positions in the area 74 effectively constitutes the page of digital data bits.

In order to direct the light from the virtual page plane 68 onto a specific small area in the memory recording plane 20, the page deflector 64 is placed with its center of deflection 78 on the optical axis 27 and at the entrance plane 68. A page address signal from the page address control network 66 causes the page deflector 64 to deflect equally both the data and reference beams 12 and 14 into a direction where a second lens 80 can cause the beams to intersect and interfere at a desired data storage area, such as 82, in the recording medium 18.

The size of the illuminated area 82 is a function of the focal length $f_2$ of the second lens 80 and its position relative to the page deflector 64 and the storage plane 20 where the recording medium 18 is situated. Since the data and reference beams 12 and 14 are parallel to each other in this embodiment, they are brought together by the second lens 80 to intersect in the lens' back focal plane, i.e., at one focal length $f_2$ behind plane of the lens 80 so that, independent of the deflection direction imposed by the page deflector 64, the beams 12 and 14 intersect somewhere on the storage plane which is centrally disposed in the recording medium 18. The location of the intersection of the beams 12 and 14 in the storage medium 18 is dependent upon the deflections introduced by the page deflector 64, while the angle of intersection is determined by the deflection imposed by the data beam deflector 37.

The storage medium 18 may be formed of any material which responds to exposure to light by yielding a change in its optical density or optical path length, e.g., by changing its index of refraction, and in which the pattern created due to one exposure is added to, but not erased by succeeding exposures since thousands of individual bit hologram exposures may be superimposed to synthesize a single page of digital data. These qualities are possessed by the majority of storage media used conventionally for holograms. For nonerasable, read-only memories, these qualities are possessed by ordinary photographic film and other permanent recording media.

While the foregoing description has included an electro-optic modulator 28 before the beam divider 54, the modulation may be imposed on either or both of the data or reference beams 12 and 14 after division. For example, the modulator 28 can be eliminated and the reference beam switch 61 used to modulate the reference beam 14.

Referring now to FIG. 3, there is shown the holographic digital data processing system 10 operating in the READ mode. The reference beam switch 61 is operated to turn off the reference beam 14 leaving only the data beam 12 passing through the apparatus. The reference beam switch 61 may be any means for occluding the reference beam 14 and preferably is an electro-optic modulator which is synchronized with the data address control network 36 and the page address control network 66 so that the reference beam is blocked whenever retrieval of digital data stored in the recording medium 18 is desired. Simultaneously, the modulator 28 is commanded to pass the laser beam 26 completely. Therefore, only an unmodulated data beam 12 remains traversing the apparatus.

Since when an individual data bit hologram is formed a unique path is established for the data beam, that path may be utilized for illuminating that individual data bit hologram during retrieval of that data bit. In other words, if the data beam deflector 37 is given a specific bit address by the data address control network 36 and the page address control network 66 supplies a specific page address to the page deflector 64, the data beam is directed along the identical path that was utilized for the data beam 12 during formation of the individual data bit hologram.

While an individual data bit hologram address is illuminated with the data beam, the reference beam 14 is reconstructed if a bit of digital data is stored at that address, i.e., if one of the component interference patterns of the multiple exposure page hologram was formed with the data beam at that particular angle. If a single photodetector 108 is placed in the image plane 24 at the intersection of that reconstructed reference beam 14, that photodetector 108 may be utilized to sense the presence or absence of a bit of digital data at that particular address. If no bit was stored in the address corresponding to the interrogating data read-out beam, then no component of the hologram pattern is capable of reconstructing the reference beam 14, and the detector 108 placed at the reference beam position in the detector plane 24 reads "zero". If a bit has been recorded there, the detector signal indicates a "one", thereby completing the requisite binary code. Of course, the code could be reversed at will.

Because of the construction of the holographic digital data processing system 10, in particular the fact that the reference beam 14 always intersects the entrance plane 68 to the page deflector 64 in precisely the same location, and regardless of the deflection of the reference beam 14 by the page deflector 64, the intersection of the reference beam 14 with the image plane 24 is constant. Therefore, regardless of which data bit hologram address is illuminated by the data beam 12, if a bit is present the reference beam 14 is reconstructed and can impinge on the single photodetector 108. By interrogating in rapid succession any sequence of page bit address combinations, a sequence of electronic signals is derived from the single detector 108 corresponding to the data that was recorded at each interrogated address.

Although this random access, direct read-out technique is specifically advantageous in a system where the holograms were recorded by the random access, direct input technique described above, it can also be used to read-out data from a hologram memory data storage plane recorded by conventional methods using the two-step, parallel input, page composer techniques. The reason is that the essential data-storing components of a hologram are the same in form, whether the data is stored in parallel or sequentially.

In the foregoing description of the holographic digital data processing system 10, the beam deflectors 37 and 64 are each represented by a pair of boxes, one assigned to each dimension of scanning. The rays of the beams are shown at the same positions at both the input and output planes of the deflectors while differing only by the angle of propagation. This is a schematic representation which does not take into account any one particular type of deflector. Most beam deflectors at least approximately meet, for small maximum deflection angles, the general requirement that the page array imaged at the center of deflection reproduces an essentially stationary image as projected by the second lens 80 onto the detector plane 24. This requirement assures that the image is always projected with the detector 108 in the same place relative to the position of the imaged data bit. When large angles of deflection are to be employed or required, compensating optical elements may have to be incorporated to stabilize the image. One may adopt special deflection techniques whereby the deflection angles for each bit address can be made different for each page deflection angle, the difference in angles being programmed into the deflector's electronic circuitry.

The reference and data laser beams 12 and 14 are selected to provide sufficiently long coherence lengths for mutual coherence at their intersection at the data storage medium 18. In the event that a laser is employed which has a relatively short coherence length, conventional path-length equalization techniques can be used to insure that the beams are coherent at the recording medium 18.

The lenses 62 and 80 are indicated in FIG. 1 as simple, single element lenses. In practice, these lenses may be much more complex and may consist of several elements depending upon the design requirements of the specific holographic recording and retrieval apparatus 10.

It should be noted that although the angle of deflection or the entrance areas of the deflectors 37 and 64 must be considerably larger for the page deflector 64 than for the data beam deflector 37, the angular deflection repeatability of both of the deflectors 37 and 64 are of the same order of magnitude.

Several modifications to system 10 as shown in FIG. 1 may be made within the scope of the invention. For example, FIG. 4 illustrates the substitution of two smaller lenses 102 and 104 for the first lens 62 of FIG. 1. The lens 102 is aligned to pass the reference beam 14 while the other lens 104 is located so as to pass the data beam 12. The use of a pair of lenses such as 102 and 104 facilitates the lens design and significantly increases the angular separation between the reference and data beams when such separation would benefit the design for specific applications.

During operation of the holographic digital data processing system 10, when data bits are to be entered into the holographic memory 18, data signals are applied to the modulator 28 to turn the laser beam 26 on or off depending upon the code being transmitted. At the same time, an address for each data bit in a page is selected with the data address signals being applied to the data beam deflector 37. A page address signal is applied to the page deflector 64 so that each data bit is recorded with a distinct recording of intersection angle between the data and reference beams 12 and 14 and at a page location such as 82.

The power of the laser beam 26, the data input rate and the time for each exposure of the data storage medium 18 are selected so that the total energy per data bit exposure is approximately equal to the optimum exposure level for the selected recording medium 18. The appropriate laser parameters are further selected on the basis of obtaining a bright reconstructed image for read-out by the detector 108.

Since the embodiment of the holographic digital data processing system 10 in FIG. 1 directs the reference beam 14 to the same detector location 108, the photodetector at that location can also be used to monitor the modulation of the beams. The photodetector 108 may then be used during recording as a feedback error signal generator to maintain the proper modulation as suggested by a line 110 coupled to the data input signal network 30.

The recording medium 18 may require chemical processing steps (such as with photographic film) to complete the recording process. In such case the removal and return of the medium 18 to the system 10 requires precise registration to preserve alignment of the reconstructed data bits with the photodetector 108 in the detector plane 24. Other materials for the recording medium 18 such as lithium niobate can be read-out immediately. Still other materials may also permit the erasure of data such as by illumination by a high intensity laser, electrical stimulation from a network 112 or other processes.

Having described a holographic data recording and playback system according to the invention, the various advantages thereof ccan be appreciated. The requirement of an intermediate page composer has been eliminated and a high quality signal-to-noise ratio is obtained with the reduction of scattered light near the read-out detector 108. As a result, the reference beam 14 may be placed near the data beam 12 to enable the use of the same optics for both beams. A higher data storage capability is obtained since the low end of the spatial frequency range may be used on the recording medium 18. The laser power is efficiently used. A group of data may be recorded in a random access sequence by simply deflecting the data beam to any specific bit position of a desired group.

While there have been shown and described what are considered to be the presently preferred embodiments of the invention, it will be obvious to those of ordinary skill in the art that various modifications may be made therein without departing from the spirit of the invention as defined by the appended claims.

I claim:

1. A holographic digital data processing system in which data may be stored and retrieved in a sequential manner comprising a source of a beam of coherent energy, a beam divider for dividing the beam of coherent energy into a reference beam and a data beam, a modulator for impressing a bit of digital data on at least one of the beams of coherent energy, a first beam deflector which deflects the data beam by a first preselected angle selected from a first matrix array of angles, means for by-passing the first beam deflector with the reference beam to establish a unique spatial relationship between the data beam and the reference beam, a second beam deflector which deflects both the data beam and the reference beam by a second preselected angle selected from a second matrix array of angles, a recording medium in which a hologram may be formed, means for focussing the data beam and the reference beam into the recording medium so that the data beam and the reference beam interfere and form a hologram of the bit of digital data in the recording medium, the second preselected angle determining the position of the hologram in the recording medium and the first preselected angle determining the angle of intersection of the data beam and the reference beam at the recording medium whereby the hologram of the bit of digital data has a unique address within the recording medium and may be stored in the recording medium in a sequential manner, means for selectively occluding the reference beam before reaching the recording medium so that only the data beam is directed onto the recording medium at the hologram of the bit of digital data thereby forming an image of the single bit of digital data beyond the recording medium at a fixed location defined by the reference beam when the hologram is recorded, and a photodetector located at the image of the bit of digital data so that the image bit of digital data located at a particular address in the recording medium may be retrieved individually in a sequential manner.

2. A holographic digital data processing system according to claim 1, wherein the means for selectively occluding the reference beam is located in the reference beam before the second beam deflector so that during retrieval both beam deflectors affect only the data beam.

3. A holographic digital data processing system according to claim 1, wherein the means for selectively occluding the reference beam is a second electro-optic modulator.

4. A holographic digital data processing system according to claim 3, wherein the second electro-optic modulator interrupts the reference beam before the reference beam by-passes the first beam deflector.

5. A holographic digital data processing system according to claim 4, wherein the recording medium is a permanent recording medium thereby forming a read-only memory.

6. A holographic digital data processing system according to claim 4, wherein the recording medium is erasable and wherein there is further included means for erasing digital data stored in the recording medium.

7. A holographic digital data processing system according to claim 4, wherein the first and second beam deflectors are acousto-optic beam deflectors.

8. A holographic digital data processing system according to claim 7, wherein there is further included means for collimating the data beam and the reference beam prior to entrance into the second beam deflector.

9. A holographic digital data processing system according to claim 8, wherein the means for by-passing is a plurality of reflective elements for diverting the reference beam around the first beam deflector.

10. A holographic digital data processing system according to claim 4, wherein the source of a beam of coherent energy is a laser.

11. A holographic digital data processing system according to claim 1, wherein the beam of coherent energy is modulated prior to division thereby having both the data beam and the reference beam modulated.

12. A method for holographically processing digital data comprising the steps of producing a beam of coherent energy, dividing the beam of coherent energy into a reference beam and a data beam, modulating at least one of the beams of coherent energy with a bit of digital data, deflecting the data beam by a first preselected angle selected from a first matrix array of angles, maintaining the reference beam at a second preselected angle to establish a unique spatial relationship between the data beam and the reference beam, deflecting both the data beam and the reference beam by a third preselected angle selected from a second matrix array of angles, focussing the data beam and the reference beam onto a recording medium so that the beams interfere and form a hologram of the bit of digital data in the recording medium, the third preselected angle determining the position of the hologram in the recording medium and the first and second preselected angles determining the angle of intersection of the data beam and the reference beam at the recording medium whereby the hologram of the bit of digital data has a unique address within the recording medium and may be stored in a sequential manner, selectively occluding the reference beam before reaching the recording medium so that only the data beam is directed onto the recording medium at the hologram of the bit of digital data thereby forming an image of the single bit of digital data beyond the recording medium at a fixed location defined by the reference beam when the hologram is recorded, and detecting the bit of digital data at the image so that the unique bit of digital data located at a particular address in the recording medium may be retrieved individually in a sequential manner.

13. A method for holographically processing digital data according to claim 12, wherein the modulation step occurs prior to the beam division step so that the bit of digital data is impressed on both the data beam and the reference beam.

14. A method holographically processing digital data according to claim 13, wherein there is further included the step of collimating the data and reference beam prior to the deflection by the third preselected angle.

15. A holographic digital data read-out system for sequentially retrieving bits of digital data stored in a holographic memory, the holographic memory having a plurality of pages of digital data stored in separate areas thereof and having the individual data bits comprising each page superimposed in an area through variance of the direction of intersection of a first interfering beam for each data bit at formation, the direction of intersection of the other interfering beam being constant for each page and intersecting an image plane at a constant location, the system comprising:

a source of a beam of coherent energy, a first beam deflector which deflects the beam of coherent energy by a first preselected angle selected from a first matrix array of angles, a second beam deflector which deflects the beam of coherent energy by a second preselected angle selected from a second matrix array of angles, means for focussing the beam of coherent energy into the holographic memory, the second preselected angle causing the beam of coherent energy to intersect the holographic memory at the location of the page of digital data to be interrogated and the first preselected angle causing the beam of coherent energy to intersect the holographic memory at the direction of intersection of the first interfering beam at formation for an individual digital data bit in the page which is desired to be retrieved, and a photodetector located in the image plane at the location of intersection of the other interfering beam during formation so that the imaged bit of digital data located at a particular address in the holographic memory may be retrieved individually in a sequential manner.

* * * * *